(12) United States Patent
Yu et al.

(10) Patent No.: US 10,868,135 B2
(45) Date of Patent: *Dec. 15, 2020

(54) HIGH ELECTRON MOBILITY TRANSISTOR STRUCTURE

(71) Applicant: Taiwan Semiconductor Manufacturing Company, Ltd., Hsinchu (TW)

(72) Inventors: Chen-Ju Yu, Yilan County (TW); Chih-Wen Hsiung, Hsinchu (TW); Fu-Wei Yao, Hsinchu (TW); Chun-Wei Hsu, Taichung (TW); King-Yuen Wong, Tuen Mun (HK); Jiun-Lei Jerry Yu, Hsinchu County (TW); Fu-Chih Yang, Kaohsiung County (TW)

(73) Assignee: TAIWAN SEMICONDUCTOR MANUFACTURING COMPANY, LTD., Hsin-Chu (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/219,705

(22) Filed: Dec. 13, 2018

(65) Prior Publication Data
US 2019/0131427 A1   May 2, 2019

Related U.S. Application Data

(60) Continuation of application No. 15/443,861, filed on Feb. 27, 2017, now Pat. No. 10,164,047, which is a
(Continued)

(51) Int. Cl.
*H01L 29/66* (2006.01)
*H01L 29/423* (2006.01)
(Continued)

(52) U.S. Cl.
CPC .... *H01L 29/66462* (2013.01); *H01L 21/0254* (2013.01); *H01L 21/2258* (2013.01);
(Continued)

(58) Field of Classification Search
None
See application file for complete search history.

(56) References Cited

U.S. PATENT DOCUMENTS 6,586,781 B2   7/2003   Wu et al.
6,849,882 B2   2/2005   Chavarkar et al.
(Continued)

OTHER PUBLICATIONS

Kim, Minki, et al., "High Breakdown Voltage Al GaN/GaN HEMTs Employing Recessed Gate Edge Structure", DS Mantech Conference, May 17-20, 2010, Portland Oregon, pp. 237-240.
(Continued)

*Primary Examiner* — Shaun M Campbell
(74) *Attorney, Agent, or Firm* — Haynes and Boone, LLP

(57) ABSTRACT

A high electron mobility transistor (HEMT) includes a silicon substrate, an unintentionally doped gallium nitride (UID GaN) layer over the silicon substrate. The HEMT further includes a donor-supply layer over the UID GaN layer, a gate structure, a drain, and a source over the donor-supply layer. The HEMT further includes a dielectric layer having one or more dielectric plug portions in the donor-supply layer and top portions between the gate structure and the drain over the donor-supply layer. A method for making the HEMT is also provided.

20 Claims, 14 Drawing Sheets

Related U.S. Application Data continuation of application No. 14/533,864, filed on Nov. 5, 2014, now Pat. No. 9,583,588, which is a division of application No. 13/650,610, filed on Oct. 12, 2012, now Pat. No. 8,884,308.

(60) Provisional application No. 61/564,650, filed on Nov. 29, 2011.

(51) Int. Cl.

| | |
|---|---|
| *H01L 29/778* | (2006.01) |
| *H01L 29/10* | (2006.01) |
| *H01L 29/20* | (2006.01) |
| *H01L 21/02* | (2006.01) |
| *H01L 21/225* | (2006.01) |
| *H01L 21/3065* | (2006.01) |
| *H01L 21/3205* | (2006.01) |
| *H01L 21/321* | (2006.01) |
| *H01L 21/3213* | (2006.01) |
| *H01L 21/324* | (2006.01) |
| *H01L 29/201* | (2006.01) |
| *H01L 29/205* | (2006.01) |
| *H01L 29/06* | (2006.01) |
| *H01L 29/08* | (2006.01) |

(52) U.S. Cl.
CPC ........ *H01L 21/3065* (2013.01); *H01L 21/321* (2013.01); *H01L 21/324* (2013.01); *H01L 21/32051* (2013.01); *H01L 21/32133* (2013.01); *H01L 29/0653* (2013.01); *H01L 29/0843* (2013.01); *H01L 29/1029* (2013.01); *H01L 29/201* (2013.01); *H01L 29/2003* (2013.01); *H01L 29/205* (2013.01); *H01L 29/42316* (2013.01); *H01L 29/66431* (2013.01); *H01L 29/7787* (2013.01)

(56) References Cited

U.S. PATENT DOCUMENTS

| | | | |
|---|---|---|---|
| 7,030,426 B2 | 4/2006 | Neidig et al. | |
| 7,030,428 B2 | 4/2006 | Saxler et al. | |
| 7,038,252 B2 * | 5/2006 | Saito | H01L 29/1066 257/103 |
| 7,229,903 B2 | 6/2007 | Li et al. | |
| 7,230,284 B2 | 6/2007 | Parikh et al. | |
| 7,517,737 B2 | 4/2009 | Li et al. | |
| 7,569,870 B2 | 8/2009 | Yanagihara et al. | |
| 7,709,269 B2 | 5/2010 | Smith et al. | |
| 7,851,825 B2 | 12/2010 | Suh et al. | |
| 7,859,014 B2 | 12/2010 | Nakayama et al. | |
| 7,875,910 B2 | 1/2011 | Sheppard et al. | |
| 7,928,475 B2 | 4/2011 | Parikh et al. | |
| 8,188,515 B2 | 5/2012 | Machida et al. | |
| 8,404,508 B2 | 3/2013 | Lidow et al. | |
| 8,445,942 B2 | 5/2013 | Baba et al. | |
| 8,476,125 B2 | 7/2013 | Khan et al. | |
| 8,513,672 B2 | 8/2013 | Saxler et al. | |
| 8,674,407 B2 | 3/2014 | Ando et al. | |
| 8,680,536 B2 | 3/2014 | Khalil et al. | |
| 9,583,588 B2 * | 2/2017 | Yu | H01L 29/42316 |
| 2004/0144991 A1 * | 7/2004 | Kikkawa | H01L 29/2003 257/103 |
| 2004/0201038 A1 * | 10/2004 | Kimura | H01L 29/66462 257/192 |
| 2005/0236365 A1 | 10/2005 | Komatani et al. | |
| 2006/0220065 A1 * | 10/2006 | Kawasaki | H01L 21/28587 257/200 |
| 2007/0205433 A1 | 9/2007 | Parikh et al. | |
| 2009/0173968 A1 | 7/2009 | Matsunaga et al. | |
| 2009/0230331 A1 * | 9/2009 | Koudymov | H01L 29/7787 250/493.1 |
| 2009/0315075 A1 * | 12/2009 | Sato | H01L 29/0657 257/192 |
| 2010/0219452 A1 | 9/2010 | Brierley et al. | |
| 2011/0057257 A1 * | 3/2011 | Park | H01L 29/4236 257/330 |
| 2011/0147798 A1 * | 6/2011 | Radosavljevic | H01L 21/2256 257/194 |
| 2011/0241088 A1 * | 10/2011 | Sato | H01L 29/7787 257/288 |

OTHER PUBLICATIONS

Saito, Wataru et al., "High Breakdown Voltage AlGaN—GaN Power-HEMT Design and High Current Density Switching Behavior", IEEE Transactions on Electron Devices, vol. 50, No. 12, December 3002, pp. 2528-2531.

\* cited by examiner

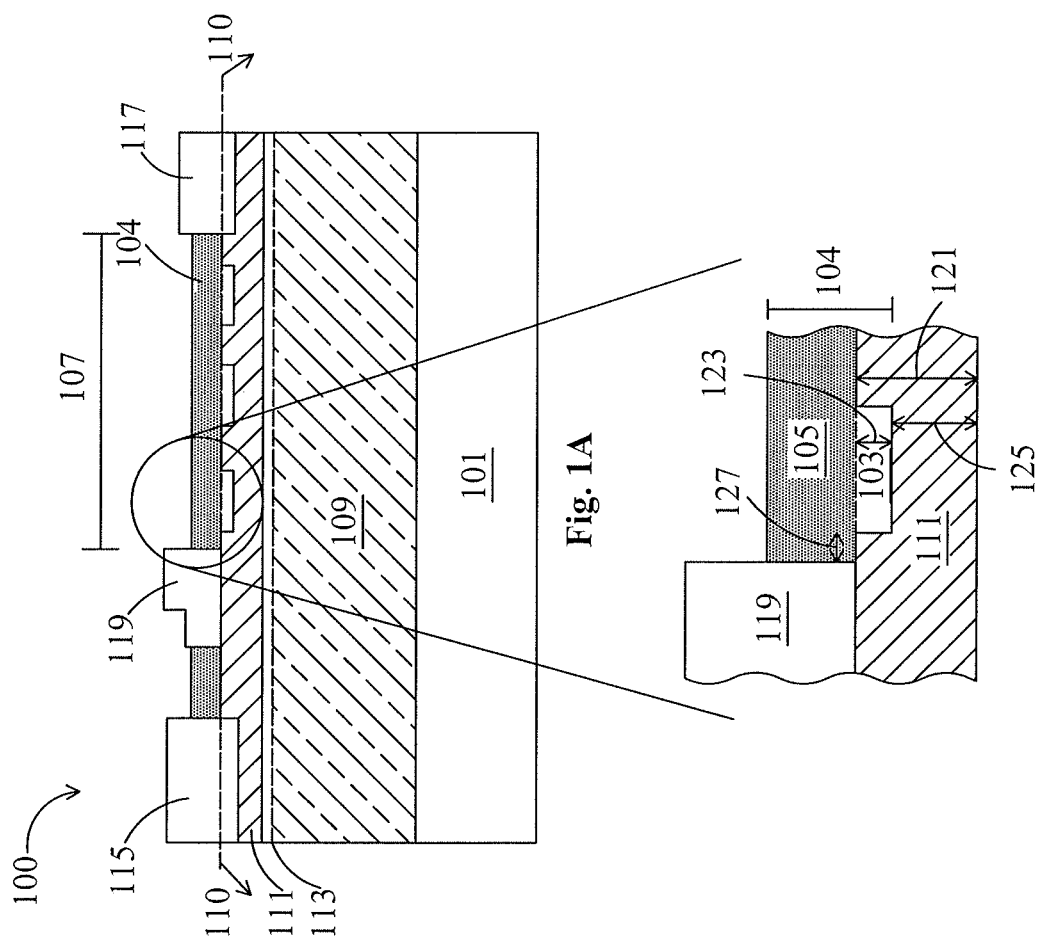

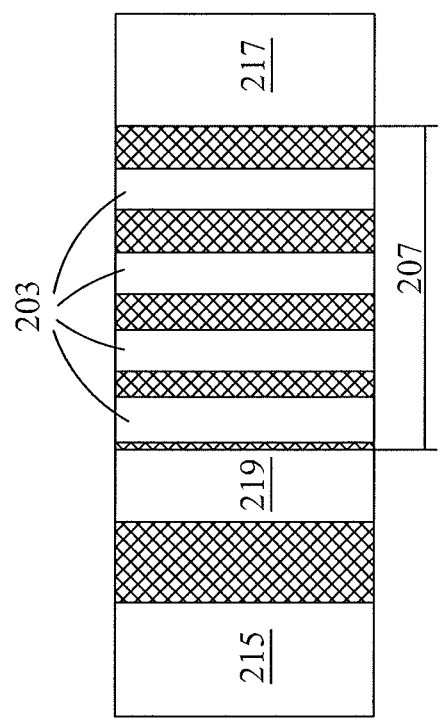

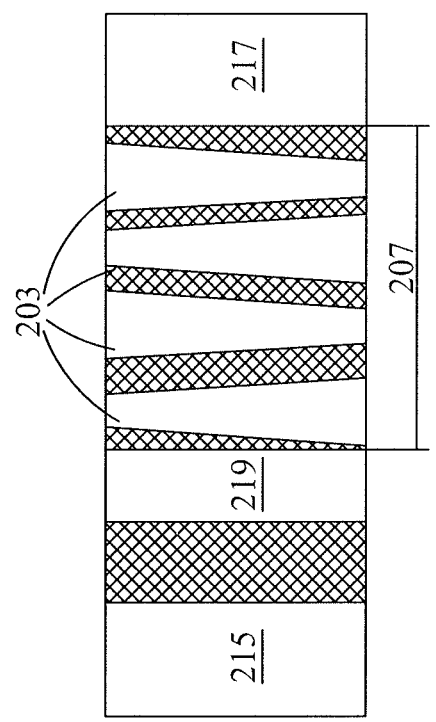

HIGH ELECTRON MOBILITY TRANSISTOR STRUCTURE

PRIORITY CLAIM

The present application is a continuation application of U.S. application Ser. No. 15/443,861, filed Feb. 27, 2017, issuing as U.S. Pat. No. 10,164,047, which is a continuation application of U.S. application Ser. No. 14/533,864, filed Nov. 5, 2014, now U.S. Pat. No. 9,583,588, which is a divisional application of U.S. application Ser. No. 13/650,610, filed Oct. 12, 2012, now U.S. Pat. No. 8,884,308, which claims priority from U.S. Provisional Application No. 61/564,650 filed Nov. 29, 2011, which are incorporated herein by reference in their entireties.

TECHNICAL FIELD

This disclosure relates generally to semiconductor circuit manufacturing processes and, more particularly, to a group-III group-V (III-V) compound semiconductor based transistor.

BACKGROUND

Group-III group-V compound semiconductors (often referred to as III-V compound semiconductors), such as gallium nitride (GaN) and its related alloys, have been under intense research in recent years due to their promising applications in power electronic and optoelectronic devices. The large band gap and high electron saturation velocity of many III-V compound semiconductors also make them excellent candidates for applications in high temperature, high voltage, and high-speed power electronics. Particular examples of potential electronic devices employing III-V compound semiconductors include high electron mobility transistor (HEMT) and other heterojunction bipolar transistors.

During operation, a HEMT forms a large surface electric field around a gate edge, which affects the depletion region curve in a drift region between a gate structure and a drain. While large electric field is one of the benefits of HEMT for use in power applications, the distribution of the depletion region during operation can negatively affect the breakdown voltage for the HEMT. When negative bias is applied to the gate of the HEMT, the depletion region curve is formed directly under the gate and causes high surface electric field concentration around the gate edge. The electric field concentration around the gate decreases breakdown voltage.

In order to improve breakdown voltage, a metallic field plate is sometimes added over or next to the gate structure over a passivation layer that is between the gate structure and the drain. The field plate modulates the surface electric field distribution and enhances the breakdown voltage. However, new structures with high breakdown voltage for III-V compound semiconductor based transistors and methods for forming them continue to be sought.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 1A is a cross sectional view of a high electron mobility transistor (HEMT) structure in accordance with various embodiments of the present disclosure.

FIG. 1B is an expanded view of a portion of the HEMT of FIG. 1A.

FIGS. 2A to 2D are top views of a portion of the HEMT structure of FIG. 1A from view plane 110 of FIG. 1A in accordance with various embodiments of the present disclosure.

DETAILED DESCRIPTION

Figure 2B:
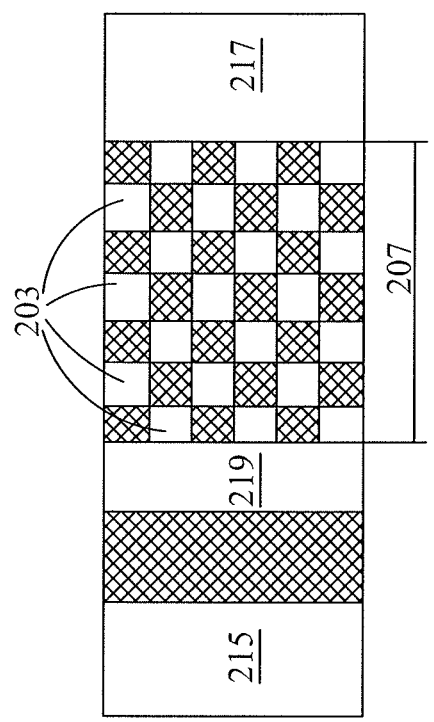

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the invention and do not limit the scope of the disclosure.

A novel structure for group-III group-V (referred to as III-V hereinafter) semiconductor based transistors and methods for forming the structures are provided. Throughout the description, the term "III-V compound semiconductor" refers to compound semiconductor materials comprising at least one group III element and one group-V element. The term "III-N compound semiconductor" refers to a III-V compound semiconductor in which the group V element is nitrogen. Example stages of manufacturing an illustrative embodiment of the present disclosure are disclosed. Those skilled in the art will recognize that other manufacturing steps may take place before or after the described stages. Other stages of manufacturing that may substitute some of the example stages may be discussed. Those skilled in the art will recognize that other substitute stages or procedures may be used. Throughout the various views and illustrative embodiments of the present disclosure, like reference numbers are used to designate like elements.

The present disclosure provides a structure and a method to form III-V compound semiconductor-based transistors having high breakdown voltage. FIG. 1A shows an example power transistor device 100 according to various embodiments of the present disclosure. FIG. 1B shows an expanded view of a portion of the power transistor device 100 of FIG. 1A. The power transistor device 100 may be a high electron mobility transistor (HEMT).

The HEMT 100 is formed over a silicon substrate 101. A number of layers are grown over the silicon substrate 101 using an epitaxial process. The layers include an optional nucleation layer of aluminum nitride layer (not shown), an optional buffer layer (not shown), and a bulk gallium nitride layer 109, which may be grown over the buffer layer. The bulk gallium nitride (GaN) layer 109 is a channel layer for the HEMT 100.

HEMT 100 includes an active layer 111 on top of the bulk GaN layer 109. The active layer 111, also referred to as donor-supply layer, is grown on the channel layer 109. An interface is defined between the channel layer 109 and the donor-supply layer 111. A carrier channel 113 of two-dimensional electron gas (2-DEG) is located at the interface. In at least one embodiment, the donor-supply 111 is an aluminum gallium nitride (AlGaN) layer. The AlGaN layer has a formula of $Al_xGa_{(1-x)}N$, wherein x varies between about between about 0.1 and 1.0. It has a thickness in a range from about 5 nanometers to about 50 nanometers. In other embodiments, the donor-supply layer 111 may include an AlGaAs layer, or AlInP layer.

A band gap discontinuity exists between the AlGaN layer 111 and the GaN layer 109. The electrons from a piezoelectric effect in the AlGaN layer 111 drop into the GaN layer 109, creating a thin layer 113 of highly mobile conducting electrons in the GaN layer 109. This thin layer 113 is referred to as a two-dimensional electron gas (2-DEG), forming a carrier channel (also referred to as the carrier channel 113). The thin layer 113 of 2-DEG is located at an interface of the AlGaN layer 111 and the GaN layer 109. Thus, the carrier channel has high electron mobility because the GaN layer 109 is undoped or unintentionally doped, and the electrons can move freely without collision or substantially reduced collision with the impurities.

A source feature 115 and a drain feature 117 are disposed on the AlGaN layer 111 and configured to electrically connect to the carrier channel 113. Each of the source feature 115 and the drain feature 117 comprises a corresponding intermetallic compound. The intermetallic compound is may be embedded in the AlGaN layer 111 and may be further embedded in a top portion of the GaN layer 109. In one example, the intermetallic compound comprises Al, Ti, or Cu. In another example, the intermetallic compound comprises AN, TiN, $Al_3Ti$ or $AlTi_1N$.

The HEMT 100 also includes a gate structure 119 disposed on the AlGaN layer 111 between the source feature 115 and the drain feature 117. The gate 119 includes a conductive material layer which functions as the gate electrode configured for voltage bias and electrical coupling with the carrier channel 113. In various examples, the conductive material layer may include a refractory metal or its compounds, e.g., tungsten (W), titanium nitride (TiN) and tantalum (Ta). Other commonly used metals in the conductive material layer include nickel (Ni) and gold (Au). The gate structure may include one layer or many layers.

According to various embodiments of the present disclosure, a dielectric layer 104 covers a drift region 107 of the donor-supply layer 111 between the gate structure 119 and drain 117. The dielectric layer 104 includes a dielectric plug portion and a top portion over the dielectric plug portion. FIG. 1B shows an expanded view of a portion of the HEMT 100 in the drift region 107 close to the gate structure 119. Dielectric layer 104 includes a first portion 103, also referred to as dielectric plug portion 103, and a second portion 105, also referred to as a top portion 105. The dielectric plug 103 is embedded in the donor-supply layer 111 and has a height 123. The donor-supply layer 111 under the dielectric plug 103 has a thickness 125, which is less than a bulk donor-supply layer thickness 121. The top portion 105 of the dielectric layer 104 has a relatively constant thickness.

While FIG. 1B shows one dielectric plug 103, the dielectric layer 104 may include one or many dielectric plugs 103. A height 123 of the dielectric plugs 103 may be about 3 nm to about 10 nm. In some cases, the height of the dielectric plugs 103 may depend on the thickness 121 of the donor-supply layer 111. In some embodiments, the donor-supply layer thickness 125 under the dielectric plug 103 is at least 40% of the thickness 121 of other portions of the donor-supply layer 111. In other embodiments, the donor-supply layer thickness 125 is at least about 15 nanometers. Thus, if the bulk donor-supply layer thickness 121 is 25 nanometers, then the dielectric plug height 123 may be less than about 10 nanometers, by ensuring first that the donor-supply layer thickness 125 under the dielectric plug is at least 15 nanometers. In another example, if the bulk donor-supply layer thickness 121 is 50 nanometers, the dielectric plug thickness 123 may be up to about 30 nm, or up to about 60% of the bulk donor-supply layer thickness. Generally, the donor-supply layer 111 under the dielectric plug 103 has a thickness sufficient to avoid affecting the ability of the carrier channel 113 to conduct during operation. Yet the dielectric plug height 123 of the dielectric plug should be enough to affect the surface electric field around the gate structure 119.

In other examples, the dielectric plug height 123 depends on the electrical properties and the physical dimensions of the HEMT 100. For example, short dielectric plugs 103, for example, less than 40% of the bulk donor-supply layer thickness, may be used when the bulk gallium nitride layer 109 is thick and the drift region 107 is much larger than the region between the gate structure 119 and the source 115. In these circumstances, the breakdown voltage is naturally high and a lesser amount modulation of the surface electric field may be sufficient. On the other hand, when the bulk gallium nitride layer 109 is thin or when the bulk layer is of a material with a low Ec value, the dielectric plug 103 may be taller, for example, up to about 60% of the bulk donor-supply layer thickness. During operation when the drain is subjected to a high voltage, the depletion region formed may extend past a thin gallium nitride layer 109 and interact with the underlying substrate. Similar rationale applies when the distance between the gate structure 119 and the drain 117 (drift region 107) is small. During operation when the drain is subjected to a high voltage, the depletion region curve may extend past a short drift region 107. Thus, taller dielectric plugs 103 may be used to effectively modulate the surface electrical field.

In FIG. 1B, the dielectric plug 103 is shown located a distance 127 away from the gate structure 119. Distance 127 may be between zero to several micrometers, and may be negative in some embodiments. In certain embodiments, the dielectric plug adjoins the gate structure edge. In other embodiments, the dielectric plug may even be slightly under the gate structure edge. Distance 127 is not greater than a width of the dielectric plug 103 to provide good efficacy to modulate the surface electric field at the gate structure edge.

The dielectric layer 104 is deposited over the donor-supply layer 111 having cavities etched therein. The etching may occur before or after the source, drain, and gate structure formations. However, the dielectric layer 104 is usually deposited after the gate structure is formed to avoid the additional step of removing a portion of the dielectric layer 104 for the gate structure 119. The dielectric layer 104 may be silicon oxide, silicon nitride, silicon oxynitride, carbon doped silicon oxide, carbon doped silicon nitride, carbon doped silicon oxynitride, zinc oxide, zirconium oxide, hafnium oxide or titanium oxide. The dielectric layer is deposited using a known process such as chemical vapor deposition (CVD).

FIGS. 2A to 2D are top views of various dielectric plugs in accordance with various embodiments of the present disclosure. The top views of the HEMT 100 of FIG. 1A cut along line 110. Line 110 separates the dielectric layer 104 into top portion 105 and dielectric plug 103.

FIG. 2A shows a total of four dielectric plugs 203 in a drift region 207. As shown in FIG. 2A, four dielectric plugs 203 are dispersed between the gate structure 219 and drain 217, although fewer or more dielectric plugs may be used. Each dielectric plug 203 has a width. In FIG. 2A, the dielectric plug 203 proximate to the gate structure 219 has the largest width. The other dielectric plugs 203 have the same width.

According to certain embodiments, a widest of the dielectric plugs 203 is closest to the gate structure 119. While not required for the present disclosure to reduce breakdown voltage of the transistor 100, having wider dielectric plugs closest to the gate structure 119 result in greater reductions of breakdown voltages.

In some embodiments, the dielectric plugs 203 are the same width and may be equally spaced. In examples where multiple dielectric plugs are used, the widths of dielectric plug and drift region 207 not occupied by any dielectric plug adjacent to the dielectric plug may be between about 3:1 to about 1:3, for example, width 225 to width 227 in FIG. 2A. In other embodiments, a sum of total dielectric plug widths may be about 40% to about 75% of the total drift region 207 width.

In FIG. 2A, the features all have the same length so that the widths are a proxy for area. However, the dielectric plugs need not have same lengths, shapes or sizes. A total dielectric plug area may be about 40% to about 75% of the total drift region 207 area.

FIG. 2B shows checkered pattern dielectric plugs 203. This design may be used to smooth the surface electric field by interspersing the dielectric plugs 203 throughout the drift region 207. A ratio of a dielectric plug area to an adjacent area of the drift region 207 that is not occupied by a dielectric plug 203 may be about 3:1 to about 1:3. As shown in FIG. 2B, the ratio is about 1:1. In some embodiments, the dielectric plugs 203 are not the same size.

Figure 2D:
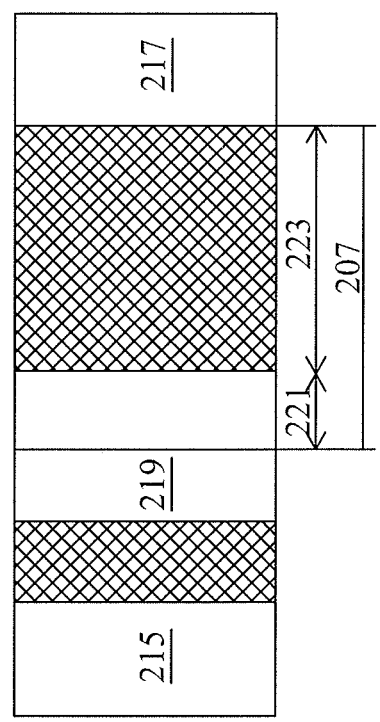

FIG. 2C shows trapezoidal dielectric plugs 203. The trapezoidal dielectric plugs 203 have a shorter width and a longer width. FIG. 2D shows a top view having only one dielectric plug 203. In this example where only one dielectric plug 203 is used, the dielectric plug area as a percentage of the total drift region area is between about 5% to about 20%. In other embodiments where more than one dielectric plug is used, a total dielectric plug area may be about 40% to about 75% of the total drift region area.

The various dielectric plugs shown in FIGS. 2A to 2D are merely examples. The dielectric plugs may be polygons, such as quadrilaterals shown in FIGS. 2A-2D. The dielectric plugs may have more than four sides or may be circular or irregular.

Figure 3A:
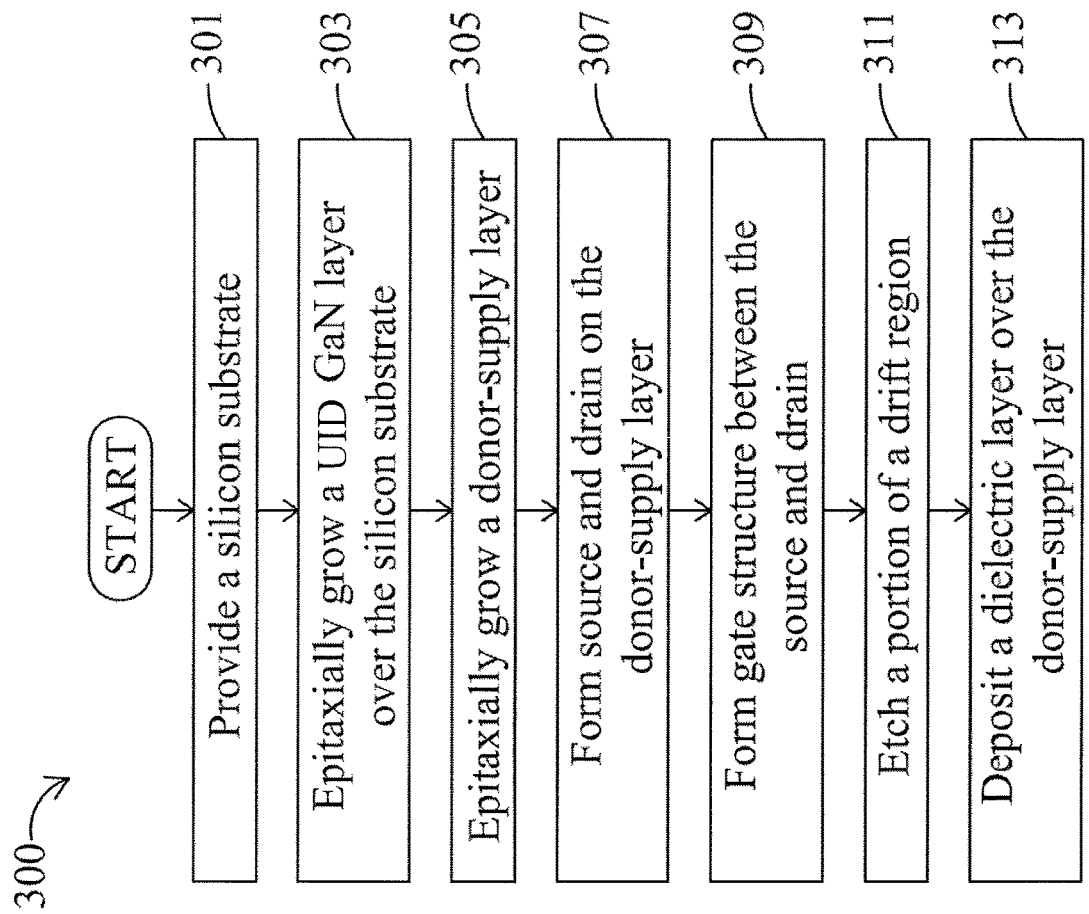
FIGS. 3A to 3C are flow charts of methods for forming a HEMT structure in accordance with certain embodiments of the present disclosure.
Figure 3B:
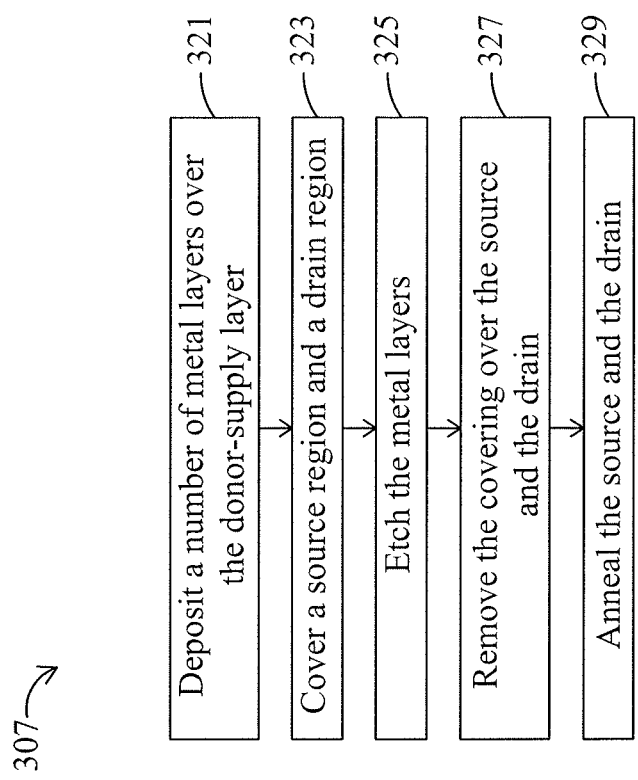
Figure 3C:
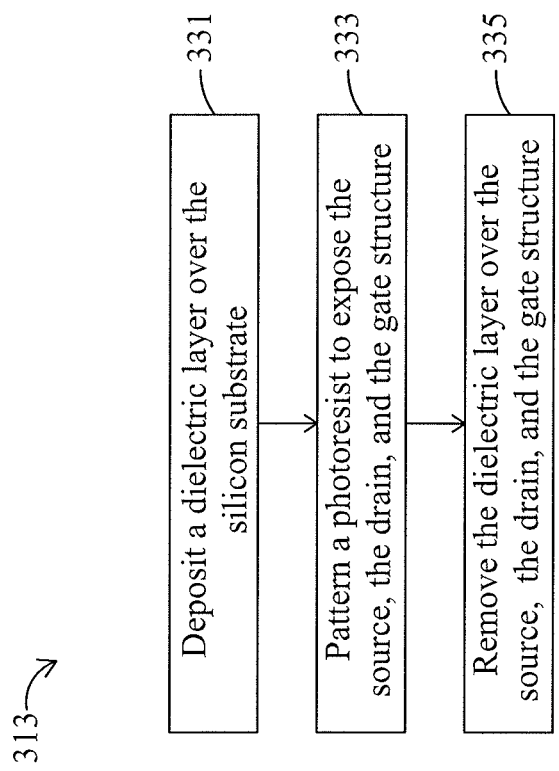

FIGS. 3A to 3C are process flow charts illustrating various operations of a method to form the HEMT of the present disclosure. FIGS. 3A to 3C are discussed in association with FIGS. 4A to 4E that shows a partially fabricated HEMT in various stages of manufacturing. FIG. 3A illustrates a process flow 300 that describes operations to make a HEMT in accordance with various embodiments of the present disclosure. In the first operation 301, a silicon substrate is provided. FIGS. 4A to 4E show the silicon substrate 401. Note that the various elements in the figures are not drawn to scale. While HEMTs are often manufactured on a substrate other than silicon substrate, such as sapphire and silicon carbide, the methods and structures disclosed herein are specific silicon fabrication processes and silicon-based structures.

Referring to FIG. 3A, in operation 303, a bulk layer of undoped gallium nitride (u-GaN) is epitaxially grown over the silicon substrate. The -u-GaN layer is shown in FIGS. 4A to 4E as layer 409 over the silicon substrate 401. The bulk layer of undoped gallium nitride 409 is epitaxially grown over the silicon substrate 401, which may include intervening layers such as a nucleation layer and/or a buffer layer. The bulk layer of gallium nitride 409 does not include any dopant, but may include contaminants or impurities that are incorporated in the film unintentionally. The bulk layer of gallium nitride may be referred to as an unintentionally doped gallium nitride (UID GaN) layer. The UID gallium nitride may be about 0.5 microns to about 1 micron thick. The UID GaN layer is grown under high temperature conditions. The process may be metal organic CVD (MOCVD), metal organic vapor phase epitaxy (MOVPE), plasma enhanced CVD (PECVD), remote plasma enhanced CVD (RP-CVD), molecular beam epitaxy (MBE), hydride vapor phase epitaxy (HVPE), chloride vapor-phase epitaxy (Cl-VPE), and liquid phase epitaxy (LPE). Using metal organic vapor phase epitaxy (MOVPE) using gallium-containing precursor and nitrogen-containing precursor. The gallium-containing precursor includes trimethylgallium (TMG), triethylgallium (TEG), or other suitable chemical. The nitrogen-containing precursor includes ammonia ($NH_3$), trimethylaluminum (TMA), phenyl hydrazine, or other suitable chemical.

Referring to FIG. 3A, in operation 305, a donor-supply layer is grown over the UID GaN layer. The donor-supply layer is shown in FIGS. 4A to 4E as layer 411 over the UID GaN layer 409. The donor-supply layer 411 can be epitaxially grown on the GaN layer 409 by MOVPE using an aluminum-containing precursor, a gallium-containing precursor, and a nitrogen-containing precursor. The aluminum-containing precursor includes TMA, TEA (triethylaluminum), or other suitable chemical. The gallium-containing precursor includes TMG, TEG, or other suitable chemical. The nitrogen-containing precursor includes ammonia, tertiarybutylamine (TBAm), phenyl hydrazine, or other suitable chemical.

The band gap discontinuity between the donor-supply layer 411 and the UID GaN layer 409 forms a carrier channel 413 at the interface between the two layers 411 and 409. The carrier channel 413 is also called a two-dimensional electron gas (2-DEG), where electrons have high mobility when the transistor is on.

Figure 4A:
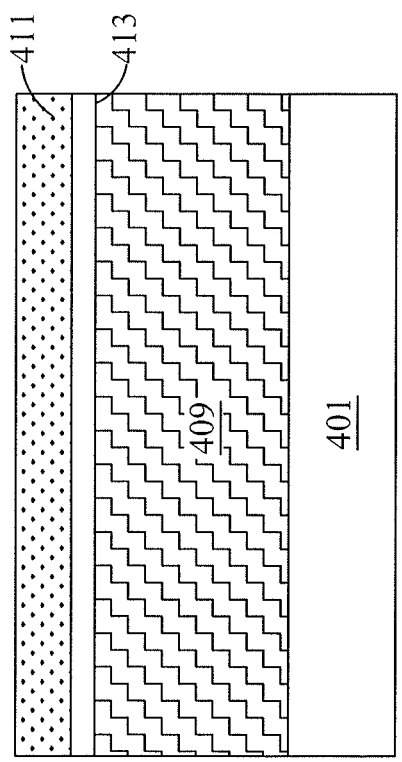
FIGS. 4A to 4E are cross section schematics of a HEMT in various stages of formation according to various method embodiments of the present disclosure.
Figure 4B:
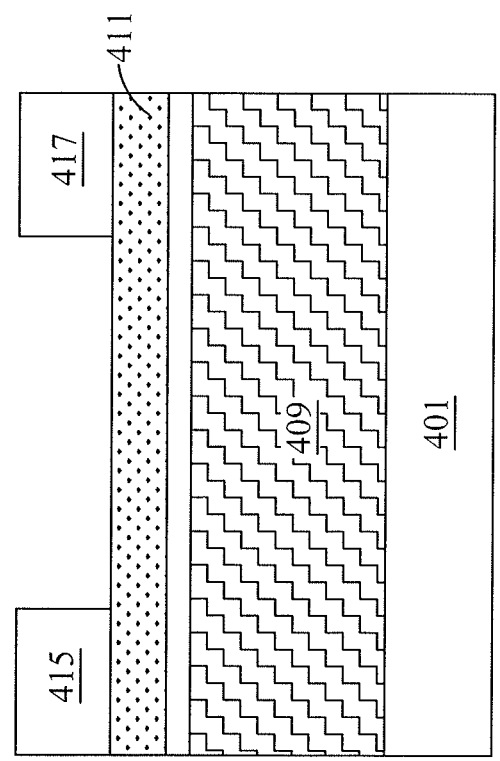
Figure 4C:
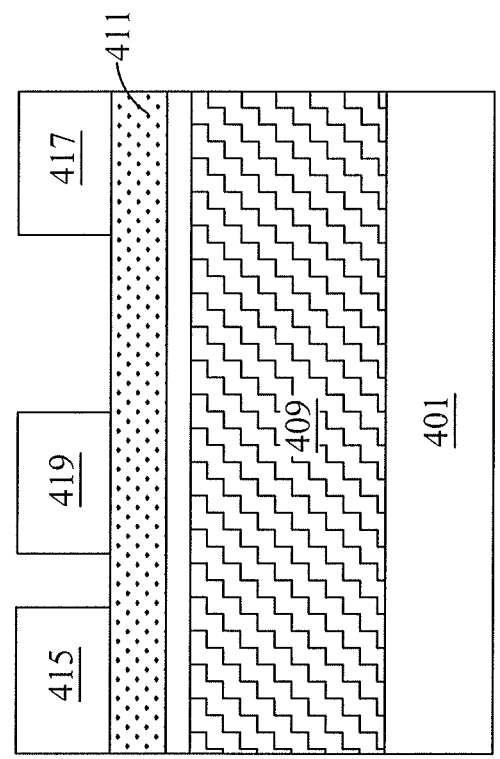

Referring to FIG. 3A, in operation 307 a source and a drain is formed on the donor-supply layer. FIG. 4B shows the source 415 and the drain 417 on the donor-supply layer 411. In some embodiments, the source 415 and the drain 417 are intermetallic compounds or alloys. The intermetallic compound may be formed by constructing a patterned metal layer over the donor supply layer 411 or fully or partially in a cavity of the donor-supply layer 411. The patterned metal layer may then be annealed such that the metal layer, the donor-supply layer 411 and optionally the GaN layer 409 react to form the intermetallic compound. Because of the anneal, the metal elements in the intermetallic compound may diffuse into the donor-supply layer 411 and the GaN layer 409. The intermetallic compound contacts the carrier channel 413 located at the interface of the donor-supply layer 411 and the GaN layer 409. The intermetallic compound may improve electrical connection and form ohmic contacts between the source/drain features and the carrier channel 413. In one example, the intermetallic compound is formed in a cavity of the donor-supply layer 411 as well as a portion of the donor-supply layer around the cavity such that the intermetallic compound follows the contour of the donor-supply layer 411 and has a non-flat top surface. In another example, intermetallic compound overlies a portion of the donor supply layer 411.

FIG. 3B further separates the operation 307 into detailed sub-operations. In operation 321, a number of metal layers are deposited over the donor-supply layer, which may include openings etched in the donor-supply layer for the source and the drain. The metal layers may include titanium, aluminum, and copper. In one example, the metal layers are a titanium, aluminum, and titanium stack. The metal layers are deposited using a physical vapor deposition (PVD) process. A plasma is formed in a chamber proximate to a target containing the metal to be deposited. Ions in the plasma bombard the target causing metal particles to sputter off. The sputtered metal particles deposit onto the substrate forming a metal layer. The metal layers conform to the surface topography of the donor-supply layer.

In operation 323, a source region and a drain region of the metal layer are covered. In some embodiments, a photolithographic process is used to cover the metal layers to be protected. A photoresist is deposited and exposed to a light pattern that modifies the property of the photoresist. Depending on the type of photoresist, exposed portions or unexposed portions are removed by developing the photoresist, leaving only some portions of the photoresist on the metal layers. The covering is used as a mask in subsequent processing. Other materials such as a patterned hardmask may be used also. The hardmask would be deposited first, patterned, and etched to define the source and drain.

In operation 325, the metal layers are etched. The mask or photoresist from operation 323 is an etch mask that protects the source and drain from being removed. Dry etch using plasma removes the metal layers that are not protected, down to the donor-supply layer. Suitable plasma etch techniques includes reactive ion etching (RIE) and inductively coupled plasma (ICP) etching. Depending on the selectivity of an etchant of the metal over the underlying donor-supply layer, the metal layer may be slightly over-etched to ensure a clean surface.

In operation 327, the covering over the source and the drain is removed. If the covering is photoresist, then the removal process is ashing and stripping. If the covering is a hardmask, then the removal process may involve etching with different plasma etchants from that of operation 325. At this point the partially fabricated structure resembles the structure of FIG. 4B. Thereafter in operation 329, the source and the drain may be annealed in a rapid thermal anneal (RTA) process. Annealing can create an intermetallic compound or an alloy. In one embodiment, an alloy is created in an inert environment at about 800 to 900 degrees Celsius. In another embodiment, an intermetallic compound containing nitrogen is created in a nitrogen environment. Other annealing environments include an oxygen environment for creating some conductive oxides and ambient environment. As discussed, annealing the source and drain may also result in interaction of the metal layers with underlying material from the donor-supply layer. The result may be a source and drain that includes material from the underlying layers. In effect, in some embodiments, a size of the source and/or drain increases because some metal diffuses into the donor-supply layer and some aluminum, gallium, and nitrogen from the donor-supply layer diffuses into the source and the drain.

Referring back to FIG. 3A, in operation 309, a gate structure is formed between the source and the drain. Similar to the source/drain formation process, the gate structure is formed in a number of steps. According to some embodiments, the gate structure may be defined first by a photolithography process or the source/drain may be protected first. The gate material is then deposited in a CVD process or a metal CVD process over the donor-supply layer. As discussed, the gate material may include one or more of tungsten (W), titanium nitride (TiN) and tantalum (Ta). Excess gate material is then etched away to achieve the structure of FIG. 4C. The structure of FIG. 4C includes a gate structure 419 between a source 415 and a drain 417 over the donor-supply layer 411.

Figure 4D:
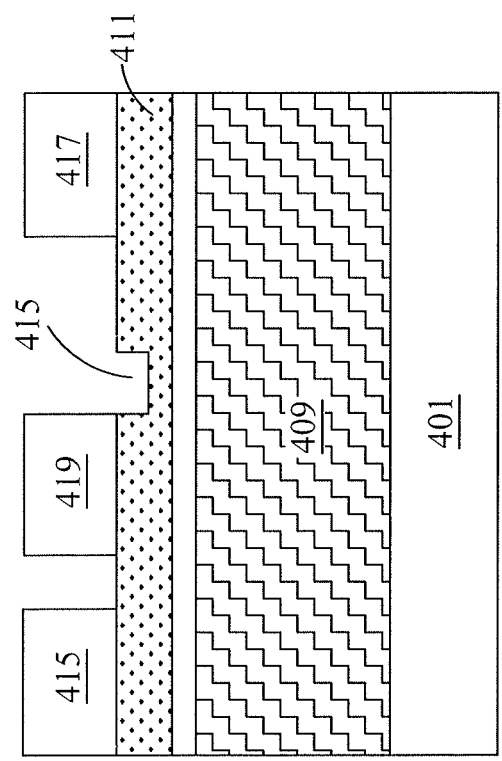
Figure 4E:
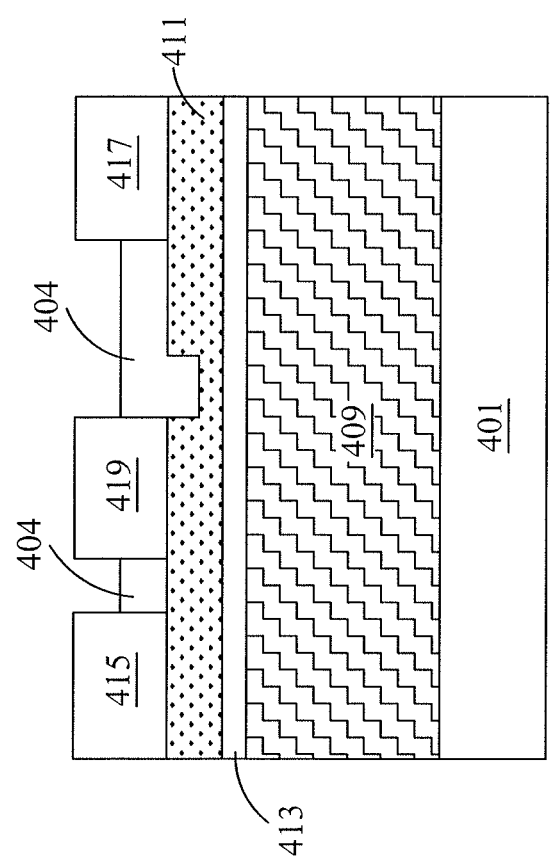

Referring back to FIG. 3A, in operation 311, a portion of the donor-supply layer in the drift region is etched. A photoresist layer may be first deposited and patterned to protect the source/drain, the gate structure, and parts of the donor-supply layer that is not to be etched. The etch pattern may be one of the various configurations from FIGS. 2A to 2D, or others as discussed or designed by one skilled in the art according to the inventive concepts in this disclosure. The etch process and etchant material are carefully selected to prevent over etching the donor-supply layer, which would cause the HEMT to operate incorrectly and change electrical properties of the HEMT. As discussed, a portion of the donor-supply layer or at least a specified thickness of the donor-supply layer should not be removed. Thus, a slow etch process is used to control the amount etched. In some embodiments, a chlorine-based etchant is used in a plasma to etch at a rate of about 1 nanometer per minute. At this slow rate, the amount etched can be precisely controlled. In other embodiments, a fluorine-based etchant may be used, with process parameters that tends to slow the etch rate. For example, the plasma power and pressure may be reduced in the chamber. FIG. 4D shows the partially fabricated HEMT with an opening 415 in the drift region of the donor-supply layer 411. Although only one opening 415 is shown, various embodiments include any number of at least one opening as discussed in association with FIG. 2A to 2D.

Once the openings or cavities are formed in the donor-supply layer, the photoresist protecting the source/drain, the gate structure, and the parts of the donor-supply layer is removed. In operation 313, a dielectric layer is deposited over the donor-supply layer. FIG. 3C shows this operation 313 in more detail. A dielectric layer is deposited over the silicon substrate in operation 331. The dielectric fills the openings etched in operation 311 of FIG. 3A and completely covers the donor-supply layer between the source and gate structure and between the gate structure and the drain. The dielectric layer is also formed over the source/drain and the gate structure. The dielectric layer may be silicon oxide, silicon nitride, silicon oxynitride, carbon doped silicon oxide, carbon doped silicon nitride, carbon doped silicon oxynitride, zinc oxide, zirconium oxide, hafnium oxide or titanium oxide. The dielectric layer is deposited using a known process such as chemical vapor deposition (CVD).

In operation 333, a photoresist is deposited and patterned to expose the source, the drain, and the gate structure. The dielectric layer over the source, the drain, and the gate structure are removed in operation 335 with an etch process to result in the structure of FIG. 4E. Dielectric layer 404 is formed over donor-supply layer 411 between the source 415 and gate structure 419 and between the gate structure 419 and drain 417. Note that while a flat dielectric film 404 is shown, depending on the thickness of the dielectric layer 404 the top surface of the dielectric layer may have a dish shape, the edges against the metal structures being thicker than a middle portion. In some embodiments, the dielectric film 404 may be deposited to exceed the height of the metal structures (415, 419, and 417) and then planarized down to the same height using a chemical-mechanical polishing (CMP) process. Then a flat top dielectric layer 404 may be achieved by further plasma etching the dielectric layer 404, if a dielectric layer thickness less than the thickness of the metal structures is sought. After the basic HEMT structure is formed, subsequent operations include depositing contacts and first layer of metal interconnect along with intermetallic dielectric (IMD) material using semiconductor processes and designs known in the art.

Figure 5:
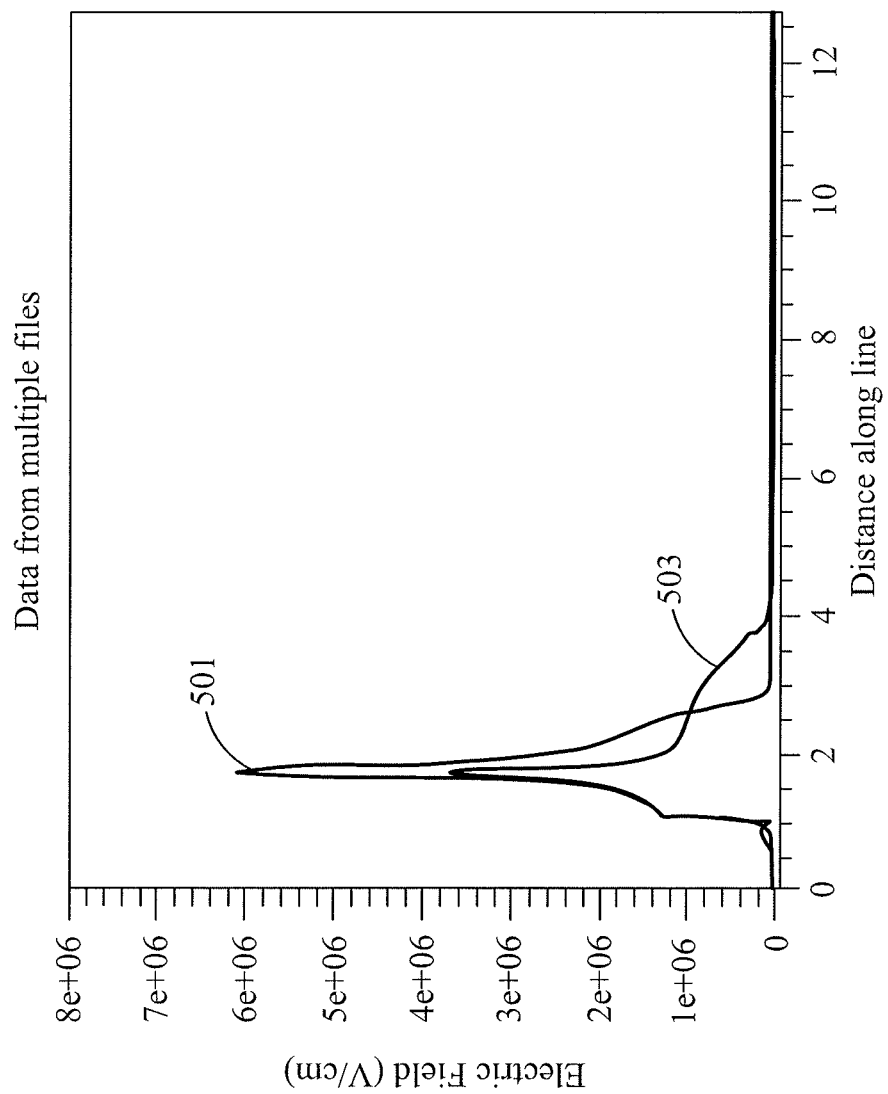
FIG. 5 is a plot of simulated peak surface electric field as a function of position on the HEMT structures in accordance with various embodiments of the present disclosure.

FIG. 5 is a plot of simulated peak surface electric field as a function of position on the HEMT structures in accordance with various embodiments of the present disclosure. Electric field in volts per centimeter is plotted against a distance along line across the HEMT from a distal edge of the source at distance 0, through the gate structure between about distances 1.5 and 2, to a distal edge of the drain at distance 12.5. The simulation models a gate voltage of −5 volts and drain bias of 600 volts. The peak corresponds to the gate structure edge closest to the drain. Line 501 is a simulated result for a HEMT without the dielectric plugs as disclosed herein. The peak electric field for line 501 is about 6E6 V/cm. Line 503 is a simulated result for a HEMT having one dielectric plugs between the gate structure and the drain. The peak electric field for line 503 is about 3.6E6 V/cm, for a reduction of about 40%. This simulated result shows that the dielectric plug structures disclosed herein do indeed reduce peak surface electric field in the HEMT. While the peak electric field value would vary depending on the structure modeled in the simulation, the relative effect of the dielectric plugs is clear.

The embodiments of the present disclosure may have other variations. For example, the dielectric plugs may include more than one material, such as a layer of nickel oxide over a layer of gallium nitride. Certain embodiments of the present disclosure have several advantageous features. The use of various doping species allows fine-tuning of the dielectric plugs, and hence the breakdown voltage, while minimizing adverse effects to other electrical properties, such as maximum forward current or leakage current.

One aspect of this description relates to a method including epitaxially growing gallium nitride (GaN) layer over a silicon substrate. The method further includes epitaxially growing a donor-supply layer over the GaN layer. The method further includes forming a source and a drain on the donor-supply layer. The method further includes forming a gate structure between the source and the drain on the donor-supply layer. The method further includes plasma etching a portion of a drift region of the donor-supply layer to a depth of less than 60% of a donor-supply layer thickness. The method further includes depositing a dielectric layer over the donor-supply layer.

Another aspect of this description relates to a method of making a high electron mobility transistor (HEMT). The method includes growing an unintentionally doped gallium nitride (UID GaN) layer over a substrate. The method further includes growing an aluminum gallium nitride (AlGaN) layer over the UID GaN layer. The method further includes etching the AlGaN layer to form at least one recess in the AlGaN layer. The method further includes forming a drain and a source over the AlGaN layer. The method further includes forming a gate over the AlGaN layer between the drain and the source. At least a portion of the gate structure is outside of each opening of the at least one opening. The method further includes depositing a dielectric layer over the AlGaN layer. The dielectric layer fills the at least one opening and extends over a top surface of the AlGaN layer.

Still another aspect of this description relates to a method of making a high electron mobility transistor (HEMT). The method includes growing a gallium nitride (GaN) layer over a substrate. The method further includes growing a donor supply layer over the GaN layer. The method further includes forming a gate, a drain and a source over the donor supply layer. The method further includes etching the donor supply layer between the gate and the drain to form a plurality of recesses in the donor supply layer. The method further includes depositing a dielectric layer over the donor supply layer. The dielectric layer fills at least one opening of the plurality of openings and extends over a top surface of the donor supply layer.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of fabricating a high electron mobility transistor (HEMT), comprising:
    epitaxially growing a first semiconductor layer over a substrate;
    epitaxially growing a second semiconductor layer over the first semiconductor layer, wherein the second semiconductor layer is grown to have a top surface;
    forming a source and a drain on a first region and a second region of the second semiconductor layer, respectively;
    forming a gate structure between the source and the drain on a third region of the second semiconductor layer, the gate structure being disposed on the top surface;
    after forming the gate structure, performing an etching process to form a plurality of recesses in a portion of the second semiconductor layer, wherein each of the plurality of recesses interposes the third region and the second region of the second semiconductor layer, and wherein a portion of the top surface of the second semiconductor layer interposes each of the plurality of recesses; and
    depositing a dielectric layer over the top surface of the second semiconductor layer and in the plurality of recesses to form a plurality of dielectric plugs interposing the second region and the gate structure.

2. The method of claim 1, wherein the epitaxially growing the first semiconductor layer includes growing an unintentionally doped gallium nitride composition.

3. The method of claim 1, wherein the performing the etching process to form the plurality of recesses includes forming a plurality of recesses each having an edge vertically aligned with an edge of the gate structure.

4. The method of claim 1, wherein the depositing the dielectric layer over exposed portions of the second semiconductor layer comprises:
    depositing a dielectric composition over the substrate;
    patterning a masking element over the dielectric composition to expose the gate structure, the source, and the drain; and
    removing the dielectric composition over the gate structure, the source, and the drain to form the dielectric layer.

5. The method of claim 1, wherein the depositing the dielectric layer includes depositing a composition selected from a group consisting of zinc oxide, zirconium oxide, hafnium oxide, titanium oxide, silicon oxide, silicon nitride, silicon oxynitride, carbon doped silicon oxide, carbon doped silicon nitride, carbon doped silicon oxynitride, and combinations thereof.

6. The method of claim 1, wherein the etching comprises exposing the substrate to a chlorine-based plasma etchant.

7. The method of claim 1, wherein the etching the plurality of recesses includes forming a plurality of recesses that are trapezoidal in shape.

8. The method of claim 1, wherein the etching the plurality of recesses includes forming a plurality of recesses in a checkered pattern.

9. The method of claim 1, wherein the forming the gate structure is performed prior to the etching.

10. The method of claim 1, wherein the etching the plurality of recesses includes forming a single recess of the plurality of recesses having an edge vertically aligned with an edge of the gate structure.

11. A method of making a high electron mobility transistor (HEMT), the method comprising:
   growing a first semiconductor layer over a substrate;
   growing second semiconductor layer over the first semiconductor layer, wherein the first and second semiconductor layer have a band gap discontinuity;
   forming a drain and a source over the second semiconductor layer, wherein the forming the drain and the source includes depositing a patterned metal layer on a first region of the second semiconductor layer;
   after forming the drain and the source, etching the second semiconductor layer to form a plurality of recesses in the second semiconductor layer, the plurality of recesses having a bottom surface defined by the second semiconductor layer, wherein a second region of the second semiconductor layer is disposed abutting the plurality of recesses on a first side and a third region of the second semiconductor layer is disposed abutting the plurality of recesses on a second side, opposite the first side;
   forming a gate over a fourth region of the second semiconductor layer between the drain and the source, wherein the plurality of recesses, the third region, and the second region each are disposed between the gate and the drain; and
   depositing a dielectric layer over the second semiconductor layer, wherein the dielectric layer fills the plurality of recesses and extends over the second region of the second semiconductor layer.

12. The method of claim 11, wherein the plurality of recesses includes a first recess and a second recess that have a different length, shape or size.

13. The method of claim 11, wherein growing the first semiconductor layer comprises growing an unintentionally doped gallium nitride layer using metal organic chemical vapor deposition (MOCVD), metal organic vapor phase epitaxy (MOVPE), plasma enhanced chemical vapor deposition (PECVD), remote plasma enhanced chemical vapor deposition (RP-CVD), molecular beam epitaxy (MBE), hydride vapor phase epitaxy (HVPE) chloride vapor-phase epitaxy (Cl-VPE), or liquid phase epitaxy (LPE).

14. The method of claim 11, wherein forming the source and the drain includes:
   depositing the patterned metal layer using physical vapor deposition; and
   annealing the patterned metal layer, wherein annealing the patterned metal layer diffuses the patterned metal layer into the first region of the second semiconductor layer to form an intermetallic compound.

15. The method of claim 14, wherein annealing the patterned metal layer diffuses the patterned metal layer into the first semiconductor layer and the intermetallic compound extends into the first semiconductor layer.

16. The method of claim 11, wherein the etching the second semiconductor layer includes forming a plurality of recesses in a checkered-pattern.

17. The method of claim 11, wherein etching the second semiconductor layer comprises plasma etching using a chlorine-based etchant or a fluorine-based etchant.

18. A method of making a transistor, the method comprising:
   growing a first semiconductor layer over a substrate;
   growing a second semiconductor layer over the first semiconductor layer;
   forming a gate, a drain and a source over the second semiconductor layer, wherein the gate has a width less than a length, the length extending in a first direction parallel a top surface of the substrate;
   etching the second semiconductor layer between a sidewall of the gate nearest the drain and the drain to form a plurality of recesses in the second semiconductor layer, wherein a first recess of the plurality of recesses is discontinuous with a second recess of the plurality of recesses, wherein etching the second semiconductor layer comprises forming the first recess having a varying width in the first direction; and
   depositing a dielectric layer over the second semiconductor layer, wherein the dielectric layer fills the first recess of the plurality of recesses.

19. The method of claim 18, wherein the first recess of the plurality of recesses that is discontinuous with the second recess is spaced a distance in a first direction, and wherein the gate extends in a second direction.

20. The method of claim 18, wherein the forming the plurality of recesses includes forming recesses having different areas.

* * * * *